(12) United States Patent
Kwak et al.

(10) Patent No.: US 8,531,415 B2
(45) Date of Patent: Sep. 10, 2013

(54) FLAT PANEL DISPLAY INTEGRATED WITH TOUCH SCREEN PANEL

(75) Inventors: Won-Kyu Kwak, Yongin (KR); Do-Youb Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 551 days.

(21) Appl. No.: 12/801,203

(22) Filed: May 27, 2010

(65) Prior Publication Data

US 2011/0057892 A1 Mar. 10, 2011

(30) Foreign Application Priority Data

Sep. 4, 2009 (KR) .......................... 10-2009-0083410

(51) Int. Cl.
*G06F 3/041* (2006.01)
(52) U.S. Cl.
USPC .......................................................... 345/173
(58) Field of Classification Search
USPC .......................................................... 345/173
See application file for complete search history.

(56) References Cited

U.S. PATENT DOCUMENTS

| | | | |
|---|---|---|---|
| 5,568,292 A | 10/1996 | Kim | |
| 6,179,679 B1 | 1/2001 | Von Gutfeld et al. | |
| 7,067,756 B2 * | 6/2006 | Cok | 200/512 |
| 8,253,692 B2 * | 8/2012 | Lai | 345/173 |
| 2004/0178997 A1 * | 9/2004 | Gillespie et al. | 345/173 |
| 2004/0233175 A1 * | 11/2004 | Chuang | 345/173 |
| 2005/0156906 A1 | 7/2005 | Chiu et al. | |
| 2007/0128966 A1 * | 6/2007 | Becken et al. | 445/25 |
| 2007/0176563 A1 * | 8/2007 | Kim et al. | 315/169.3 |
| 2008/0129898 A1 * | 6/2008 | Moon | 349/12 |
| 2008/0309623 A1 * | 12/2008 | Hotelling et al. | 345/173 |
| 2008/0309633 A1 * | 12/2008 | Hotelling et al. | 345/173 |
| 2009/0160796 A1 * | 6/2009 | Jiang et al. | 345/173 |
| 2011/0006999 A1 * | 1/2011 | Chang et al. | 345/173 |

FOREIGN PATENT DOCUMENTS

| | | |
|---|---|---|
| CN | 1295311 A | 5/2001 |
| CN | 101158764 A | 4/2008 |
| KR | 10-2005-0068231 A | 7/2005 |

(Continued)

OTHER PUBLICATIONS

Korean Office Action dated Oct. 31, 2011.
Korean Office Action in KR 10-2009-0083410, dated Feb. 8, 2011 (Kwak, et al.), Korean Office Action from prosecution of corresponding Korean application.

*Primary Examiner* — Chanh Nguyen
*Assistant Examiner* — Roy Rabindranath
(74) *Attorney, Agent, or Firm* — Lee & Morse, P.C.

(57) ABSTRACT

A flat panel display integrated with a touch screen panel comprises a lower substrate, an upper substrate having a display area and first and second non-display areas corresponding to a display area, first and second non-display areas of the lower substrate, respectively, sense patterns on the display area of the upper substrate, sense lines on the first non-display area of the upper substrate, metal patterns on areas between the sense lines and on an outer side of the sense lines, pixels on the display area of the lower substrate, a driving circuit configured to drive the pixels, and sealant disposed on the second non-display area of the lower substrate so as to bond the upper substrate to the lower substrate. The first and second non-display areas of the lower substrate are outside the display area. The driving circuit is on the first non-display area of the lower substrate.

15 Claims, 3 Drawing Sheets

(56) References Cited

FOREIGN PATENT DOCUMENTS

| KR | 10 2005-0068231 A | 7/2005 |
| KR | 10-0671643 B1 | 1/2007 |
| KR | 10-2008-0044049 A | 5/2008 |
| KR | 10 2008-0105475 A | 12/2008 |

* cited by examiner

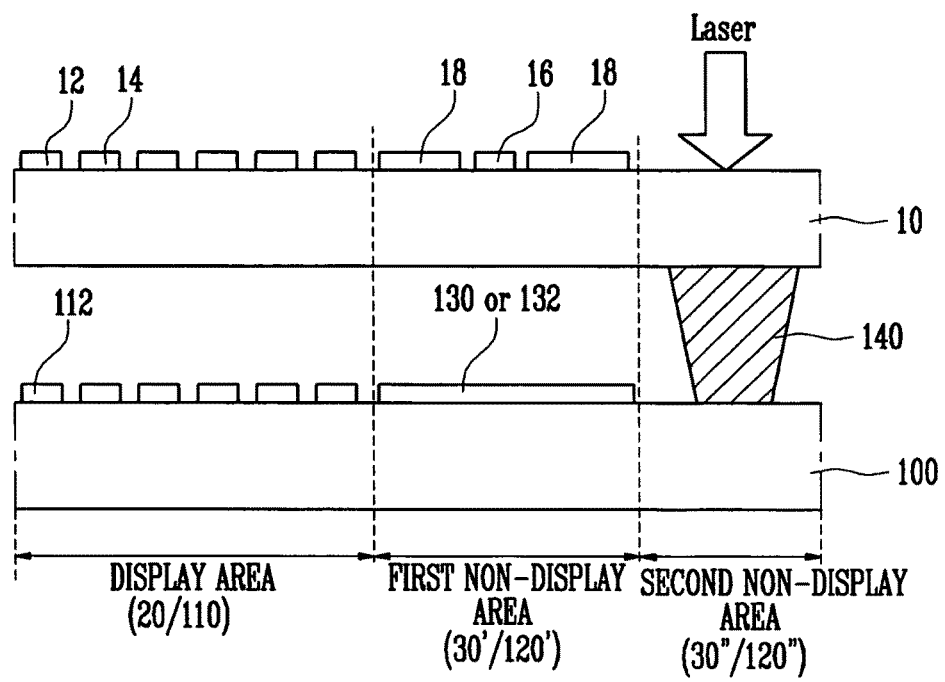

FLAT PANEL DISPLAY INTEGRATED WITH TOUCH SCREEN PANEL

BACKGROUND

1. Field

The embodiments relate to a flat panel display, and more particularly, to a flat panel display integrated with a touch screen panel.

2. Description of the Related Art

A touch screen panel is an input device into which a user can input his or her instruction by selecting instruction contents displayed on the screen of an image display device, etc. using a human hand or an object.

To this end, the touch screen panel provided on the front face of the image display device converts a location of an area directly contacted by the human hand or the object into electrical signals. Therefore, the selected instruction content on the contacted area is received as an input signal.

A separate input device that is coupled to the image display device to be operated, such as a keyboard and a mouse, may be replaced with such a touch screen panel, and the usage range of the touch screen panel has been gradually expanded.

There are a resistive type, a light sensitive type, a capacitive type, etc. of touch screen panel.

In a capacitive type of touch screen panel, conductive sense patterns may be formed. When a part of the conductive sense patterns is touched by a human hand or an object, neighboring conductive sense patterns act as a ground electrode. That is, a capacitive type of touch screen panel senses a change in capacitance, and converts a contact location into electrical signals.

Generally, the touch screen panel as described above is attached to the external surface of a flat panel display such as a liquid crystal display and an organic light emitting diode display. However, when a separately manufactured touch screen panel is attached to the flat panel display, there are problems in that the entire thickness of a product increases and the manufacturing cost thereof increases.

SUMMARY

Embodiments are therefore directed to a flat panel display, and more particularly, to a flat panel display integrated with a touch screen panel, which substantially overcome one or more of the problems due to the limitations and disadvantages of the related art.

It is therefore a feature of an embodiment to provide a flat panel display integrated with a touch screen panel, comprising: a lower substrate having a display area, a first non-display area, and a second non-display area, the first and second non-display areas being in an area outside the display area; an upper substrate having a display area, a first non-display area, and a second non-display area corresponding to the display area, the first non-display area, and the second non-display area of the lower substrate, respectively; a plurality of sense patterns on the display area of the upper substrate; a plurality of sense lines on the first non-display area of the upper substrate; metal patterns on areas between the plurality of sense lines and on an outer side of the plurality of sense lines; a plurality of pixels on the display area of the lower substrate; a driving circuit configured to drive the plurality of pixels, the driving circuit being on the first non-display area of the lower substrate; and sealant disposed on the second non-display area of the lower substrate so as to bond the upper substrate to the lower substrate.

The metal patterns may be made of the same material as the sense lines.

Each of the metal patterns on the areas between the sense lines may be of an island shape, and may not be electrically coupled with the sense lines.

The sense patterns may include an X sense pattern and a Y sense pattern arranged on different layers.

The X pattern may include a plurality of first units, each of the first units includes a plurality of first sense patterns arranged in a first direction. The Y pattern may include a plurality of second units. Each of the second units may include a plurality of second sense patterns arranged in a second direction different from the first direction. Adjacent first sense patterns in each of the first units may be electrically coupled to each other in a first direction. Adjacent second sense patterns in each of the second units may be electrically coupled to each other in the second direction.

The driving circuit may include at least one of a data driving circuit and a scan driving circuit.

The sense lines and the metal patterns may be arranged on the first non-display area of the upper substrate so as to shield the driving circuit from laser light irradiated toward the sealant.

The sealant may be melted by the irradiated laser light, and the melted sealant may be cured so as to bond the upper substrate to the lower substrate.

With the embodiment as described above, the plurality of sense lines of the touch screen panel and/or the metal patterns formed directly on the upper substrate of the flat panel display may function as the mask of the driving circuit against the laser light in a sealing process. This feature may enable the sealing process to be performed without damaging the driving circuit mounted on the lower substrate of the flat panel display. Also, manufacturing cost of the flat panel display integrated with a touch screen panel may be reduced by simplifying the manufacturing process.

BRIEF DESCRIPTION OF THE DRAWINGS

The above and other features and advantages will become more apparent to those of ordinary skill in the art by describing in detail exemplary embodiments thereof with reference to the attached drawings, in which:

FIG. 3 is a cross-sectional view illustrating a partial portion of the flat panel display according to the embodiment.

DETAILED DESCRIPTION

Figure 1:
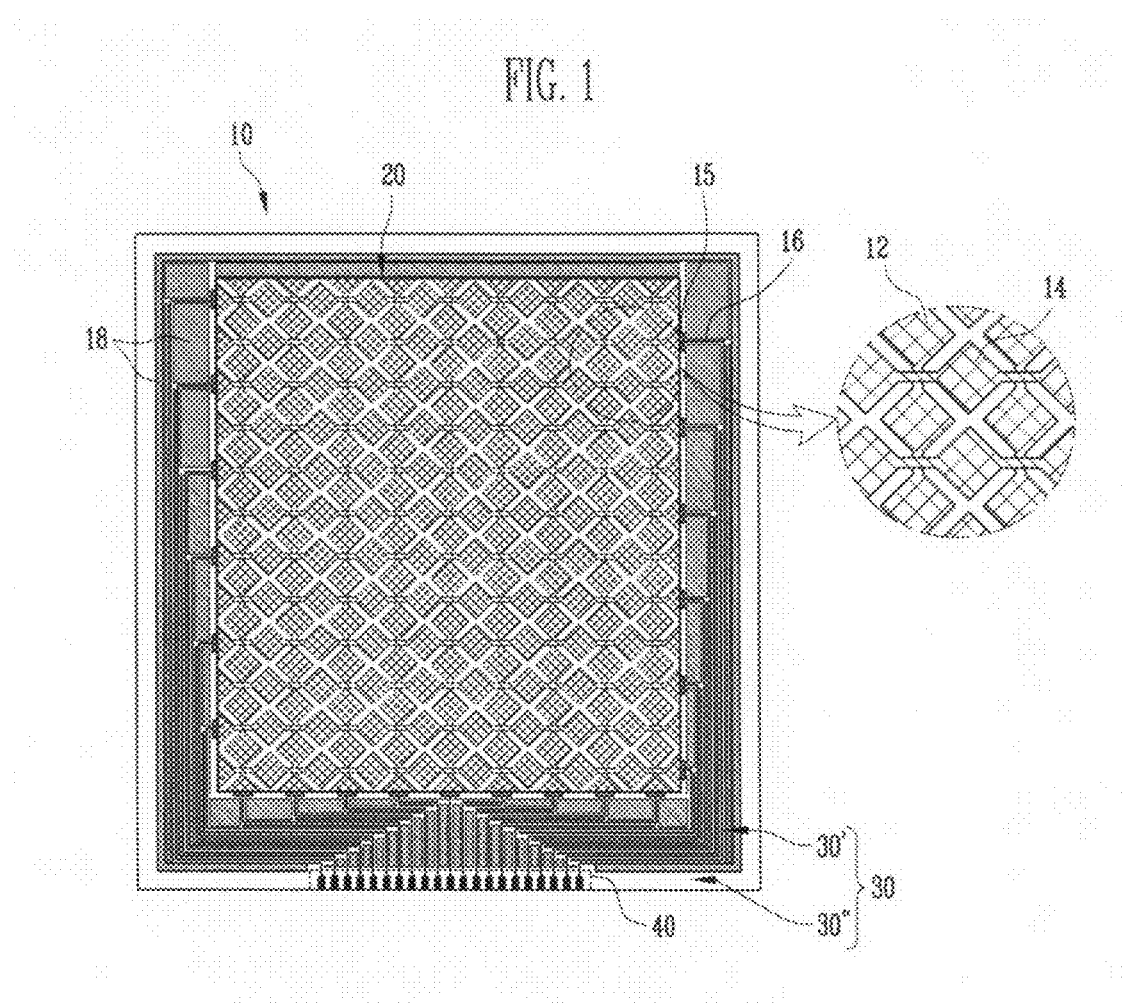
FIG. 1 is a plan view illustrating an upper substrate of a flat panel display according to an embodiment.

Korean Patent Application No. 10-2009-0083410, filed on Sep. 4, 2009, in the Korean Intellectual Property Office, and entitled: "Flat Panel Display Integrated With Touch Screen Panel," is incorporated by reference herein in its entirety.

Exemplary embodiments will now be described more fully hereinafter with reference to the accompanying drawings; however, they may be embodied in different forms and should not be construed as limited to the embodiments set forth herein. In the drawing figures, the dimensions of layers and regions may be exaggerated for clarity of illustration.

In addition, when an element is referred to as being "on" other element, it can be directly on the other element or be indirectly on the other element with one or more intervening elements interposed therebetween. Also, when an element is referred to as being "connected to" or "coupled to" other element, it can be directly connected to the other element or be indirectly connected to or coupled to the other element with one or more intervening elements interposed therebetween. Hereinafter, like reference numerals refer to like elements.

Hereinafter, exemplary embodiments will be described in more detailed with reference to the accompanying drawings.

FIG. 1 is a plan view of an upper substrate of a flat panel display according to an embodiment.

Referring to FIG. 1, a touch screen panel according to the embodiment may be formed directly on an upper substrate 10 of the flat panel display.

Here, the flat panel display may be an organic light emitting diode display or a liquid crystal display. In the embodiment, the organic light emitting diode display is described as an exemplary flat panel display. In such a case, the upper substrate 10 may function as a sealing substrate of the organic light emitting diode display. The upper substrate 10 may be made of transparent material.

The touch screen panel according to the embodiment may include an X sense pattern 12, a Y sense pattern 14, metal pads 15, sense lines 16, and metal patterns 18. The X and Y sense patterns 12 and 14 may be formed on the upper substrate 10. The metal pads 15 and the sense lines 16 may be electrically coupled to the X and Y sense patterns 12 and 14. The metal patterns 18 may be formed on the upper substrate 10 and in an area between the sense lines 16 and/or on the outer side thereof.

At this time, the X and Y sense patterns 12 and 14 may be formed on a display area 20 for displaying an image to detect a contact location. The metal pads 15, the sense lines 16, and the metal patterns 18 may be formed on a non-display area 30. The non-display area 30 may be provided outside the display area 20.

Moreover, the non-display area 30 may include a first non-display area 30' and a second non-display area 30". On the first non-display area 30', the metal pads 15, sense lines 16; and the metal patterns 18 may be formed. The second non-display area 30" may be positioned outside the first non-display area 30'.

Here, a driving circuit (not shown in FIG. 1) such as a data driving circuit, a scanning driving circuit, etc. may be arranged on a first non-display area of a lower substrate (not shown in FIG. 1) of the flat panel display. The first non-display area of the lower substrate may correspond to the first non-display area 30'.

Furthermore, the second non-display area 30" may be coated with sealant (not shown in FIG. 1) in order to bond the upper substrate of the organic light emitting diode display to the lower substrate thereof. The sealant may be cured by irradiating laser light to the second non-display area 30" so as to bond the upper substrate to the lower substrate.

The sense lines 16 and the metal patterns 18 formed on the first non-display area 30' may function as masks and shield the driving circuit against the laser light irradiated for curing the sealant. That is, the sense lines 16 and the metal patterns 18 may enable a sealing process to be performed without damaging the driving circuit.

More specifically, the metal patterns 18 may be formed on areas between the sense lines 16 and/or on the outer side thereof while the sense lines 16 are formed on the first non-display area 30'. The metal patterns 18 and the sense lines 16 arranged in such a way may function as masks against the laser light more definitely.

However, the metal patterns 18 formed between the sense lines 16 may be of an island shape between the sense lines 16 to prevent the metal patterns 18 from forming a short circuit between the sense lines 16. The metal patterns 18 may be made of the same material as the sense lines 16 through the same mask process.

As shown in FIG. 1, the X sense pattern 12 and the Y sense pattern 14 may be formed on the display area 20.

The X sense pattern 12 may include a plurality of column units, each of which includes a plurality of first patterns arranged in a first direction (column direction). The Y sense pattern 14 may include a plurality of row units, each of which includes a plurality of second sense patterns arranged in a second direction (row direction). Adjacent first sense patterns in each column unit may be electrically coupled to each other. Adjacent second sense patterns in each row unit may be electrically coupled to each other. The first sense patterns and the second sense patterns may be arranged alternately.

The X and Y sense patterns 12 and 14 as described above may be formed on different layers while a separate dielectric layer (not shown) is interposed therebetween.

In this case, the adjacent first sense patterns of the X sense pattern 12 may be patterned to be electrically coupled to each other in the first direction in a patterning step. The adjacent second sense patterns of the Y sense pattern 14 may also be patterned to be electrically coupled to each other in the second direction in a patterning step. Therefore, the process of forming a separate contact hole and coupling patterns may be omitted. Accordingly, the number of masks may be reduced and the process may be simplified.

However, this is merely one of many embodiments. The embodiments are not limited to this one embodiment.

For example, the X sense pattern 12 and Y sense pattern 14 may be formed on the same layer or on the glass substrate 10. In this case, the first sense patterns of the X sense pattern 12 or the second sense patterns of the Y sense pattern 14 may be formed in the first or second direction in the patterning step. The other patterns may be electrically coupled to each other in the step of forming the contact hole and the coupling pattern.

Moreover, the metal pads 15 may be arranged on the peripheral area of the display area 20 on which the X and Y sense patterns 12 and 14 are formed, or on the peripheral area of the first non-display area 30'. The metal pads 15 may electrically couple the X and Y sense patterns 12 and 14 to the plurality of sense lines 16 formed on the first non-display area 30'.

More specifically, each of the metal pads 15 may electrically couple one of the first sense patterns in each column unit of the X sense pattern 12 or one of the second sense patterns in each row unit of the Y sense pattern 14 to one of the sense lines 16. The sense lines 16 may electrically coupled the X and Y sense patterns 12 and 14 through the metal pads 15, thereby electrically coupling them to the driving circuit (not shown). Accordingly, the metal pads 15 may allow contact sensing signals to be transmitted to a driving circuit that drives the touch screen panel.

When the touch screen panel 10 is coupled to an external driving circuit and a FPC through a pad part 40, the sense lines 16 may be coupled between the pad parts 40 and the X and Y sense patterns 12 and 14.

If the touch screen panel is of a capacitive type, and is contacted with a human hand or an object such as a touch stick, a change in capacitance corresponding to the contact location may be transferred from the X and Y sense patterns 12 and 14 to the driving circuit via the metal pads 15 and the sense lines 16. The change in capacitance may be converted into electrical signals by an X and Y input processing circuit (not shown), etc., and the contact location may be identified.

Moreover, as aforementioned, the sealant may be cured by irradiating laser light to the second non-display area 30", and the upper substrate may be bonded to the lower substrate. Furthermore, the metal patterns 18 may be formed on the first non-display area 30' besides the sense lines 16. Thereby, the metal patterns 18 may function as masks and shield the driving circuit against the laser light irradiated to cure the sealant. Such arrangement of the sense lines 16 and the metal patterns 18 may enable the sealing process to be performed without damaging the driving circuit.

In other words, while the sense lines 16 are formed on the first non-display area 30', the metal patterns 18 may further be formed on an area between the sense lines 16 and/or on the external side thereof. Accordingly, both of the metal patterns 18 and the sense lines 16 may function as masks and shield the driving circuit against the laser light more definitely. However, each of the metal patterns 18 may be formed as an island shaped area between the respective sense lines 16 in order to prevent the metal patterns 18 from forming a short circuit between the sense lines 16.

Figure 2:
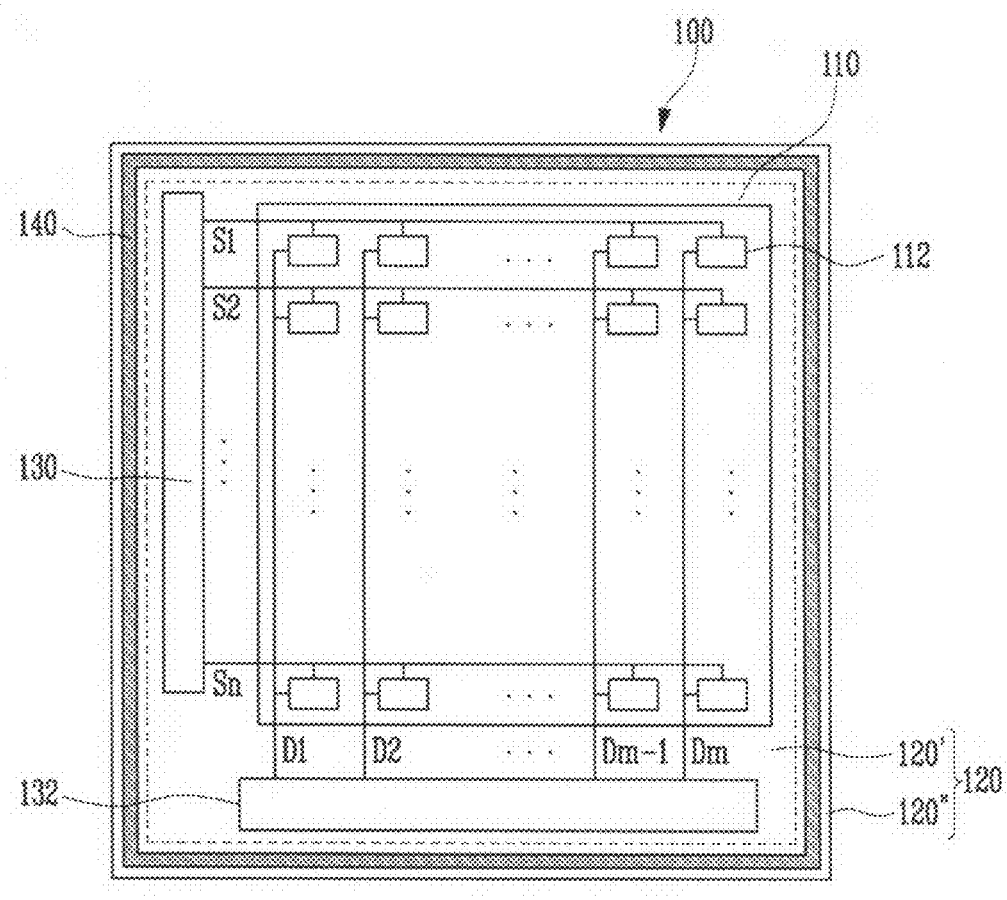
FIG. 2 is a plan view illustrating a lower substrate of the flat panel display according to the embodiment.

FIG. 2 is a plan view illustrating a lower substrate of the flat panel display according to the embodiment.

Referring to FIG. 2, a lower substrate 100 corresponding to the upper substrate may include a display area 110 and a non-display area 120. On the display area 110, a plurality of pixels 112 are formed. Each of the pixels 112 may include at least an organic light emitting element. Each organic light emitting element may comprise a first electrode, an organic layer, and a second electrode. The non-display area 120 may be formed in an area outside the display area 110.

At this time, the display area 110 may be an area on which a predetermined image is displayed by the light emitted from the organic light emitting elements. The non-display area 120 may comprise a first non-display area 120' and a second non-display area 120". On the first non-display area 120', a driving circuit configured to drive the plurality of pixels 112 on the display area 110 may be arranged. The driving circuit may include at least one of a data driving circuit 132, a scan driving circuit 130, etc. The second non-display area 120" may be positioned in an area adjacent to the periphery of the first non-display area 120'. The second non-display area 120" may have sealant 140 for bonding the lower substrate 100 to the upper substrate 10.

In other words, the display area 110, the first non-display area 120', and the second non-display area 120" of the lower substrate 100 may respectively be overlapped with the display area 20, the first non-display area 30' and the second non-display area 30" of the upper substrate 10 as shown in FIG. 1. Such arrangement is illustrated in FIG. 3.

The display area 110 may include a plurality of scan lines S1 to Sn and a plurality of data lines D1 to Dm. The plurality of scan lines S1 to Sn may be arranged in a row direction. The plurality of data lines D1 to Dm may be arranged in a column direction. The plurality of pixels 112 may be formed on the scan lines S1 to Sn and the data lines D1 to Dm. The plurality of pixels 112 may receive signals from driving circuits 130 and 132 configured to drive the organic light emitting elements.

Moreover, the driving circuits, for example, the scan driving circuit 130 and/or the data driving circuit 132, and metal wirings may be electrically coupled to the scan lines S1 to Sn and the data lines D1 to Dm in the display area 110. The driving circuits, for example, scan driving circuit 130 and/or the data driving circuit 132, may be formed on the first non-display area 120'.

Furthermore, the sealant 140 may be formed on the second non-display area 120". The sealant 140 may be disposed between the upper substrate 10 and the lower substrate 100 so as to seal the display area 110 and to prevent external air from being infiltrated thereinto.

As the sealant 140, frit in a solid state may be used. If heat applied to glass material is rapidly dropped when the frit is fabricated, frit in a form of glass powder may be generated. Generally, glass-powdered frit is used by including oxide powder. Paste in a gel state may be fabricated by adding organic material into the frit which includes the oxide powder. The paste may be burnt in the range of about 300° C. to 500° C. If the frit is burnt, the organic material may be burned off into the air. Consequently, the paste in a gel state may be cured, and the state of the frit may become solid.

As illustrated in FIG. 3, the frit as the sealant 140 may be coated on the second non-display area 30" of the upper substrate 10 and the second non-display area 120" of the lower substrate 100, and then, laser light may be irradiated thereon. In this case, the sealant 140 may be melted, and the sealant 140 in a melted state may be cured. Consequently, the upper substrate 10 may be bonded to the lower substrate 100.

At this time, laser irradiation may be performed in order to melt and cure the sealant 140. If the laser light is irradiated on the elements other than the sealant 140, particularly on the driving circuits 130 and/or 132, etc., the laser light may create a defect in the flat panel display.

In order to prevent such a defect, the sense lines 16 and the metal patterns 18 may be arranged on the first non-display area 30' of the upper substrate 10 so as to function as a mask and shield the driving circuits against the laser light irradiated to cure the sealant 140. Such arrangement of the sense lines 16 and the metal patterns 18 may enable the sealing process to be performed without damaging the driving circuits 130 and/or 132, etc.

In other words, in addition to the sense lines 16 arranged on the first non-display area 30', the metal patterns 18 may be further arranged on an area between the sense lines and/or on the outer side thereof in order to more definitely function as the mask and shield the driving circuits against the laser light.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display integrated with a touch screen panel, comprising:
    a lower substrate having a display area, a first non-display area, and a second non-display area, the first and second non-display areas being outside the display area;
    an upper substrate having a display area, a first non-display area, and a second non-display area overlapping the display area, the first non-display area, and the second non-display area of the lower substrate, respectively;
    a plurality of sense patterns on the display area of the upper substrate;
    a plurality of sense lines on the first non-display area of the upper substrate;
    metal patterns on the first non-display area of the upper substrate, the metal patterns being beside the plurality of sense lines;
    a plurality of pixels on the display area of the lower substrate;

a driving circuit on the first non-display area of the lower substrate, wherein ones of the plurality of sense lines and ones of the metal patterns overlap the driving circuit; and sealant between the second non-display area of the lower substrate and the second non-display area of the upper substrate;

wherein:

the first non-display area of the lower substrate is outside of an entirety of an outermost periphery of the display area of the lower substrate, the outermost periphery of the display area of the lower substrate enclosing each of the plurality of pixels therein, and the first non-display area of the upper substrate is outside of an entirety of an outermost periphery of the display area of the upper substrate, the outermost periphery of the display area of the upper substrate enclosing each of the plurality of sense patterns therein; and wherein the plurality of sense lines and the metal patterns are alternately arranged along a portion of the outermost periphery of the display area of the upper substrate.

2. The flat panel display integrated with the touch screen panel as claimed in claim 1, wherein the metal patterns are made of the same material as the sense lines.

3. The flat panel display integrated with the touch screen panel as claimed in claim 1, wherein each of the metal patterns on the areas between the sense lines is of an island shape, and is not electrically coupled with the sense lines.

4. The flat panel display integrated with the touch screen panel as claimed in claim 1, wherein the sense patterns include an X sense pattern and a Y sense pattern arranged on different layers.

5. The flat panel display integrated with the touch screen panel as claimed in claim 4, wherein:

the X pattern includes a plurality of first units, and each of the first units includes a plurality of first sense patterns arranged in a first direction, the Y pattern includes a plurality of second units, and each of the second units includes a plurality of second sense patterns arranged in a second direction different from the first direction, adjacent first sense patterns in each of the first units are electrically coupled to each other in the first direction, and adjacent second sense patterns in each of the second units are electrically coupled to each other in the second direction.

6. The flat panel display integrated with the touch screen panel as claimed in claim 1, wherein the driving circuit includes at least one of a data driving circuit and a scan driving circuit.

7. The flat panel display integrated with the touch screen panel as claimed in claim 1, wherein the sense lines and the metal patterns are arranged on the first non-display area of the upper substrate so as to shield the driving circuit from laser light irradiated toward the sealant.

8. The flat panel display integrated with the touch screen panel as claimed in claim 7, wherein the sealant is melted by the irradiated laser light, and the melted sealant is cured so as to bond the upper substrate to the lower substrate.

9. The flat panel display integrated with the touch screen panel as claimed in claim 1, wherein:

the driving circuit is between the outermost periphery of the display area of the lower substrate and the second non-display area of the lower substrate, and the ones of the plurality of sense lines and the ones of the metal patterns are alternately above the driving circuit.

10. The flat panel display integrated with the touch screen panel as claimed in claim 1, wherein the ones of the plurality of sense lines and the ones of the metal patterns that overlap the driving circuit are alternately arranged above the driving circuit as a shielding pattern.

11. The flat panel display integrated with the touch screen panel as claimed in claim 10, wherein an arrangement of the shielding pattern in the first non-display area of the upper substrate is different from an arrangement of the plurality of sense patterns in the display area of the upper substrate.

12. The flat panel display integrated with the touch screen panel as claimed in claim 1, wherein an arrangement of the plurality of sense lines and the metal patterns on the first non-display area of the upper substrate is different from an arrangement of the plurality of sense patterns in the display area of the upper substrate.

13. The flat panel display integrated with the touch screen panel as claimed in claim 1, wherein:

the plurality of sense patterns are connected to the plurality of sense lines through metal pads, and the plurality of sense patterns are separated from the metal patterns.

14. The flat panel display integrated with the touch screen panel as claimed in claim 1, wherein:

the plurality of sense lines are excluded from being on the second non-display area of the upper substrate, the metal patterns are excluded from being on the second non-display area of the upper substrate, the plurality of pixels display an image and are excluded from the first and second non-display areas of the lower substrate, and the plurality of sense patterns are excluded from the first and second non-display areas of the upper substrate, the plurality of sense patterns overlapping the plurality of pixels.

15. The flat panel display integrated with the touch screen panel as claimed in claim 1, wherein:

the driving circuit is connected to each of the plurality of pixels such that the driving circuit is configured to drive the plurality of pixels, and the driving circuit is arranged between the plurality of pixels and the sealant on the lower substrate.

* * * * *

(12) SUPPLEMENTAL EXAMINATION CERTIFICATE

United States Patent
Kwak et al.

(10) Number: US 8,531,415 F1
(45) Certificate Issued: Jul. 1, 2015

Control No.: 96/000,099
Primary Examiner: K. M. Reichle

Filing Date: May 26, 2015

No substantial new question of patentability is raised in the request for supplemental examination. See the Reasons for Substantial New Question of Patentability Determination in the file of this proceeding.

(56) Items of Information

FOREIGN PATENT DOCUMENTS

KR              2010-0084255         7/2010

*This is a Corrected Supplemental Examination Certificate. The Supplemental Examination Certificate issued June 24, 2015 had omitted a kind code.